(12) United States Patent
Kim et al.

(10) Patent No.: US 8,203,863 B2
(45) Date of Patent: Jun. 19, 2012

(54) NONVOLATILE MEMORY CELLS AND NONVOLATILE MEMORY DEVICES INCLUDING THE SAME

(75) Inventors: Ho-jung Kim, Suwon-si (KR); In-kyeong Yoo, Yongin-si (KR); Jai-kwang Shin, Anyang-si (KR); Chang-jung Kim, Yongin-si (KR); Myoung-jae Lee, Hwaseong-si (KR); Ki-ha Hong, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 159 days.

(21) Appl. No.: 12/801,533

(22) Filed: Jun. 14, 2010

(65) Prior Publication Data

US 2011/0128772 A1  Jun. 2, 2011

(30) Foreign Application Priority Data

Dec. 2, 2009  (KR) .................. 10-2009-0118454

(51) Int. Cl.
  *G11C 11/00* (2006.01)
  *G11C 8/00* (2006.01)
(52) U.S. Cl. .................. 365/148; 365/230.06
(58) Field of Classification Search .................. 365/148, 365/100, 230.06
  See application file for complete search history.

(56) References Cited

U.S. PATENT DOCUMENTS

| | | | |
|---|---|---|---|
| 5,926,412 A | 7/1999 | Evans, Jr. et al. | |
| 6,937,528 B2 | 8/2005 | Hush et al. | |
| 7,035,141 B1 | 4/2006 | Tripsas et al. | |
| 7,251,153 B2 | 7/2007 | Sakai | |
| 7,426,128 B2 | 9/2008 | Scheuerlein | |
| 7,436,695 B2 | 10/2008 | Nirschl et al. | |
| 7,643,328 B2 | 1/2010 | Tamura et al. | |
| 7,916,516 B2 * | 3/2011 | Wei et al. ............. | 365/148 |
| 7,948,789 B2 * | 5/2011 | Muraoka et al. ....... | 365/148 |
| 7,990,754 B2 * | 8/2011 | Azuma et al. .......... | 365/148 |
| 2007/0205456 A1 | 9/2007 | Lee et al. | |
| 2008/0123392 A1 | 5/2008 | Kinoshita | |
| 2009/0032795 A1 | 2/2009 | Kim et al. | |

FOREIGN PATENT DOCUMENTS

KR  10-2008-0027932  3/2008

(Continued)

OTHER PUBLICATIONS

Partial Search Report in corresponding European Application No. 10196971.5-1233, dated Apr. 11, 2011.

(Continued)

*Primary Examiner* — Anh Phung

(74) *Attorney, Agent, or Firm* — Harness, Dickey & Pierce, P.L.C.

(57) ABSTRACT

A nonvolatile memory cell may include a bidirectional switch having a first threshold voltage when a forward current is applied to the bidirectional switch and a second threshold voltage when a reverse current is applied to the bidirectional switch; and a variable resistor connected to the bidirectional switch in series. A state of resistance of the variable resistor may be controlled according to voltage applied to the variable resistor. A sum of a magnitude of the first threshold voltage and a magnitude of the second threshold voltage may be greater than a write voltage that is used to perform a write operation on the variable resistor.

21 Claims, 14 Drawing Sheets

FOREIGN PATENT DOCUMENTS

| | | |
|---|---|---|
| KR | 10-2008-0046123 | 5/2008 |
| KR | 10-2008-0052640 | 6/2008 |

OTHER PUBLICATIONS

Extended European Search Report dated Nov. 7, 2011, for Application No. 10196971.5-1233.

Shima Hisashi et al., "Switchable rectifier built with $Pt/TiO_x/Pt$ trilayer", Applied Physics Letters, AIP, American Institute of Physics, Melville, NY, US, vol. 94, No. 8, Feb. 26, 2009.

Ho Do Young et al., "Hysteretic bipolar resistive switching characteristics in $TiO_2/TiO_{2-x}$ multilayer homojunctions", Applied Physics Letters, AIP, American Institute of Physics, Melville, NY, US, vol. 95, No. 9, Sep. 4, 2009.

* cited by examiner

NONVOLATILE MEMORY CELLS AND NONVOLATILE MEMORY DEVICES INCLUDING THE SAME

CROSS-REFERENCE TO RELATED APPLICATIONS

This application claims priority under 35 U.S.C. §119 to Korean Patent Application No. 10-2009-0118454, filed on Dec. 2, 2009, in the Korean Intellectual Property Office (KIPO), the disclosure of which is incorporated herein in its entirety by reference.

BACKGROUND

1. Field

Example embodiments relate to nonvolatile memory cells, and more particularly, to nonvolatile memory cells and nonvolatile memory devices including the nonvolatile memory cells.

2. Description

Next generation memory devices include, for example, nonvolatile memory devices which do not require a refresh operation to retain stored data. These memory devices have high storage capacity and low power consumption. These next-generation memory devices may also be required to have a high integration like that of, for example, a dynamic random access memory (DRAM), a nonvolatile characteristic like that of, for example, a flash memory, and a high-speed of operation like that of, for example, a static RAM (SRAM) or the like. Examples of memory devices that possess the above characteristics include phase change RAMs (PRAMs), nano floating gate memories (NFGMs), polymer RAMs (Po-RAMs), magnetic RAMs (MRAMs), ferroelectric RAMs (FeRAMs), resistive RAMs (RRAMs) or the like.

SUMMARY

According to example embodiments, a nonvolatile memory cell includes a bidirectional switch having a first threshold voltage when a forward current is applied to the bidirectional switch and a second threshold voltage when a reverse current is applied to the bidirectional switch; and a variable resistor connected to the bidirectional switch in series, the variable resistor being in a high resistance state or low resistance state based on a voltage applied to the variable resistor. A sum of a magnitude of the first threshold voltage and a magnitude of the second threshold voltage is greater than a write voltage used to perform a write operation on the variable resistor.

According to example embodiments, a potential difference across the nonvolatile memory cell during the write operation is greater than or equal to a sum of the first threshold voltage and the write voltage or a sum of the second threshold voltage and the write voltage.

According to example embodiments, the write voltage includes a first write voltage having a positive value and a second write voltage having a negative value.

According to example embodiments, the first write voltage writes data '0' in the nonvolatile memory cell and is a reset voltage, and the second write voltage writes data '1' in the nonvolatile memory cell and is a set voltage.

According to example embodiments, the bidirectional switch comprises a bidirectional diode.

According to example embodiments, when the magnitude of the first threshold voltage is less than the magnitude of the second threshold voltage and a magnitude of the first write voltage is greater than a magnitude of the second write voltage, the bidirectional switch is connected to the variable resistor in the same direction as the variable resistor.

According to example embodiments, when the magnitude of the first threshold voltage is greater than the magnitude of the second threshold voltage and the magnitude of the first write voltage is less than the magnitude of the second write voltage, the bidirectional switch is connected to the variable resistor in the same direction as the variable resistor.

According to example embodiments, when the magnitude of the first threshold voltage is less than the magnitude of the second threshold voltage and the magnitude of the first write voltage is less than the magnitude of the second write voltage, the bidirectional switch is connected to the variable resistor in an opposite direction to the variable resistor.

According to example embodiments, when the magnitude of the first threshold voltage is greater than the magnitude of the second threshold voltage and the magnitude of the first write voltage is greater than the magnitude of the second write voltage, the bidirectional switch is connected to the variable resistor in an opposite direction to the variable resistor.

According to example embodiments, a nonvolatile memory device includes a memory cell array unit including a plurality of word lines, a plurality of bit lines; and a plurality of nonvolatile memory cells. The plurality of memory cells are at intersections of the plurality of bit lines and the plurality of bit lines. Each of the plurality of nonvolatile memory cells comprises a bidirectional switch and a variable resistor connected to the bidirectional switch in series. The nonvolatile memory device may also include a row driver configured to supply voltage to the plurality of word lines, the row driver including at least one replica element corresponding to the bidirectional switch and the row driver configured to control voltage applied to a nonvolatile memory cell of the plurality of nonvolatile memory cells in which a write operation is not performed.

According to example embodiments, the bidirectional switch has a first threshold voltage when a forward current is applied to the bidirectional switch and a second threshold voltage when a reverse current is applied to the bidirectional switch, and a resistance state of the variable resistor depends on a voltage applied to a word line of the plurality of word lines connected to the variable resistor and a voltage applied to a bit line of the plurality of bit lines connected to the variable resistor.

According to example embodiments, the row driver includes a first driver configured to supply a write voltage to the plurality of word lines based on a write signal and configured to supply a ground voltage to the plurality of word lines based on a discharge signal; and a second driver including the at least one replica element and configured to supply an inhibit voltage to the plurality of word lines based on a plurality of inhibit signals, the inhibit voltage being controlled by a threshold voltage of the at least one replica element.

According to example embodiments, the first driver includes a write voltage supplying unit configured to supply the write voltage when the write enable signal is activated; and a ground voltage supplying unit connected to the write voltage supplying unit and configured to supply the ground voltage when the discharge signal is activated.

According to example embodiments, the second driver includes first and second replica elements corresponding to the bidirectional switch, the first and second replica elements respectively connected to a write voltage terminal to which the write voltage is applied and a ground voltage terminal to which the ground voltage is applied; a first inhibit voltage supplying unit configured to supply a difference of the write voltage and a threshold voltage of the first replica element as a first inhibit voltage when a first inhibit signal of the plurality of inhibit signals is activated; a second inhibit voltage supplying unit configured to supply a threshold voltage of the second replica element as a second inhibit voltage when a second inhibit signal of the plurality of inhibit signals is activated; and a third inhibit voltage supplying unit configured to supply a power supply voltage as a third inhibit voltage when a third inhibit signal of the plurality of inhibit signals is activated.

According to example embodiments, the nonvolatile memory device further includes a row decoder configured to decode an input row address into an address signal and to apply the voltage supplied by the row driver to the plurality of word lines based on the address signal.

According to example embodiments, the row decoder includes a first decoder configured to decode a desired bit value of the row address into a first address signal corresponding to a plurality of main word lines; and a second decoder configured to decode a remainder of bit values of the row address not decoded by the first decoder into a second address signal, the second address signal corresponding to the plurality of word lines, and the second decoder configured to connect word lines corresponding to the second address signal to the plurality of main word lines.

According to example embodiments, at least one of the first decoder and the second decoder includes at least one replica element corresponding to the bidirectional switch.

According to example embodiments, the nonvolatile memory device further includes a row decoder configured to decode a row address into an address signal and configured to supply a voltage to the plurality of word lines according to the decoded address signal. The row decoder includes at least one replica element corresponding to the bidirectional switch and the row decoder controls the voltage supplied to the plurality of memory cells.

According to example embodiments, a resistance state of the variable resistor depends on a voltage applied to a word line of the plurality of word lines connected to the variable resistor and voltage applied to a bit line of the plurality of bit lines connected to the variable resistor.

According to example embodiments, the row decoder includes a first decoder configured to decode a desired bit value of the row address into a first address signal corresponding to a plurality of main word lines; and a second decoder configured to decode a remainder of the bit values of the row address not decoded by the first decoder into a second address signal, the second address signal corresponding to the plurality of word lines, and the second decoder configured to connect word lines corresponding to the second address signal to the plurality of main word lines.

According to example embodiments, the row driver supplies at least one of a write voltage, an inhibit voltage and a ground voltage to the plurality of word lines based on the address signal decoded by the row decoder, the row driver including at least one replica element corresponding to the bidirectional switch and the row driver configured to control the inhibit voltage applied to the memory cell of the plurality of memory cells in which a write operation is not performed.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
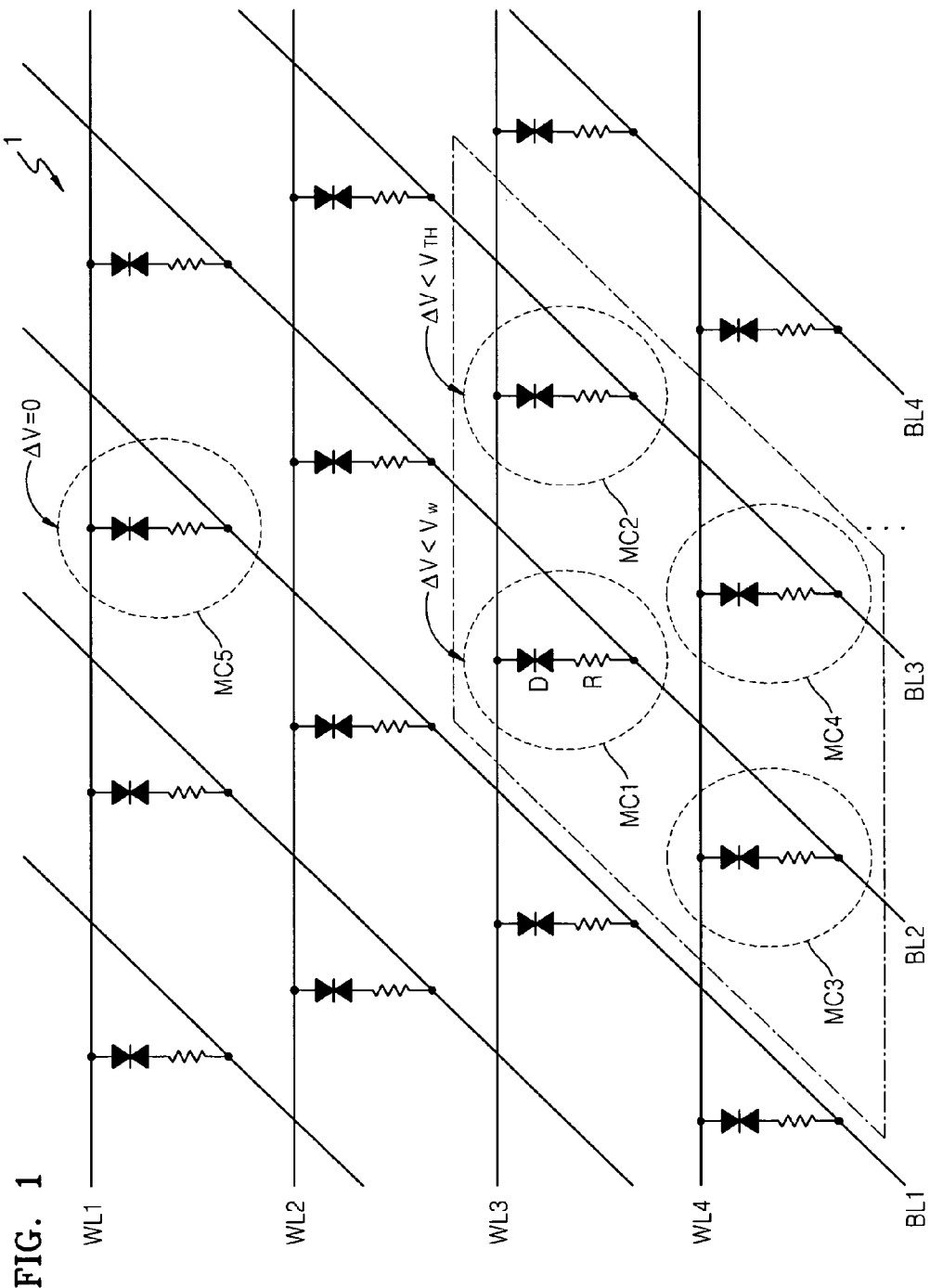
FIG. 1 is a circuit diagram of a nonvolatile memory device according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a circuit diagram of a nonvolatile memory device 1 according to example embodiments. Referring to FIG. 1, the nonvolatile memory device 1 includes a plurality of first signal lines WL1, WL2, WL3, and WL4, a plurality of second signal lines BL1, BL2, BL3, and BL4, and a plurality of memory cells MC1, MC2, MC3, MC4, and MC5. For example, the plurality of first signal lines WL1, WL2, WL3, and WL4 may be word lines, and the plurality of second signal lines BL1, BL2, BL3, and BL4 may be bit lines. Hereinafter, a case where the plurality of first signal lines WL1, WL2, WL3, and WL4 are the word lines and the plurality of second signal lines BL1, BL2, BL3, and BL4 are the bit lines will be described. However, example embodiments are not limited thereto, and the plurality of first signal lines may be the bit lines, and the plurality of second signal lines may be the word lines.

The plurality of word lines WL1, WL2, WL3, and WL4 may extend in a first direction while being parallel to one another. Only four word lines WL1, WL2, WL3, and WL4 are illustrated in FIG. 1. However, this is just an example, and the number word lines in the nonvolatile memory device 1 may be greater than or less than four.

The plurality of bit lines BL1, BL2, BL3, and BL4 may extend in a second direction that is perpendicular to the first direction while being parallel to one another. In other words, the plurality of bit lines BL1, BL2, BL3, and BL4 may intersect the plurality of word lines WL1, WL2, WL3, and WL4. Only four bit lines BL1, BL2, BL3, and BL4 are illustrated in FIG. 1. However, this is just an example, and the nonvolatile memory device 1 may include bit lines greater than or less than four.

The plurality of memory cells MC1, MC2, MC3, MC4, and MC5 may be disposed in regions in which the plurality of word lines WL1, WL2, WL3, and WL4 and the plurality of bit lines BL1, BL2, BL3, and BL4 intersect one another. Each of the plurality of memory cells MC1, MC2, MC3, MC4, and MC5 may include a bidirectional switch D and a variable resistor R connected in series to the bidirectional switch D. One end of the bidirectional switch D may be connected to one of the plurality of word lines WL1, WL2, WL3, and WL4, and one end of the variable resistor R may be connected to one of the plurality of bit lines BL1, BL2, BL3, and BL4.

Figure 2:
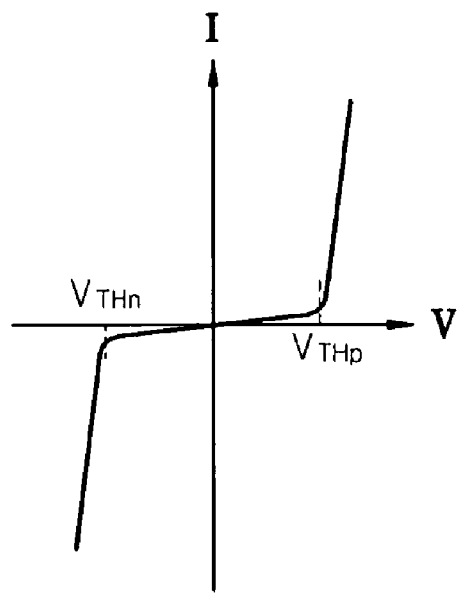
FIG. 2 is an example graph showing voltage versus current of a bidirectional switch disposed in each of a plurality of memory cells of the nonvolatile memory device of FIG. 1.

FIG. 2 is a graph showing voltage versus current (VI) characteristics of the bidirectional switch D disposed in each of a plurality of memory cells of the nonvolatile memory device of FIG. 1. Referring to FIGS. 1 and 2, the bidirectional switch D may be implemented as a bidirectional diode, for example. Hereinafter, a case where the bidirectional switch D is a bidirectional diode. However, example embodiments are not limited thereto, and the bidirectional switch D may be implemented as a transistor, for example.

The bidirectional diode D has a first threshold voltage $V_{THp}$ that is a threshold voltage in case that a forward current is applied to the bidirectional diode D and a second threshold voltage $V_{THn}$, that is a threshold voltage in case that a reverse current is applied to the bidirectional diode D. In detail, when a voltage smaller than the first threshold voltage $V_{THp}$ is applied to the bidirectional diode D in a forward direction, the bidirectional diode D may not turned on and thus, current may not flow through the bidirectional diode D. On the other hand, when voltage that is greater than or equal to the first threshold voltage $V_{THp}$ is applied to the bidirectional diode D in the forward direction, the bidirectional diode D may turn on and thus, current may flow through the bidirectional diode D in the forward direction. Similarly, when a voltage smaller than the second threshold voltage $V_{THn}$ is applied to the bidirectional diode D in a reverse direction, the bidirectional diode D may not turn on and thus, current may not flow through the bidirectional diode D. On the other hand, when a voltage greater than the second threshold voltage $V_{THn}$ is applied to the bidirectional diode D in the reverse direction, the bidirectional diode D may be turned on and thus, current may flow through the bidirectional diode D in the reverse direction.

For example, the bidirectional diode D may include two diodes that are connected to each other in parallel in opposite directions. A smaller of the forward threshold voltages of the two diodes may be a first threshold voltage of the bidirectional diode D, and a smaller of the backward threshold voltages of the two diodes may be a second threshold voltage of the bidirectional diode D. Alternatively, the bidirectional diode D may include a Zener diode. A breakdown voltage of the Zener diode may be the second threshold voltage of the bidirectional diode D.

In this way, when a positive voltage that is greater than the magnitude of the first threshold voltage $V_{THp}$ is applied to the bidirectional diode D, the bidirectional diode D is turned on in the forward direction, and when a negative voltage that is greater than the magnitude of the second threshold voltage $V_{THn}$ is applied to the bidirectional diode D, the bidirectional diode is turned on in the reverse direction. Thus, a voltage that is used to turn on the bidirectional diode D has to be greater in magnitude than the first threshold voltage $V_{THp}$ or the second threshold voltage $V_{THn}$.

Figure 3:
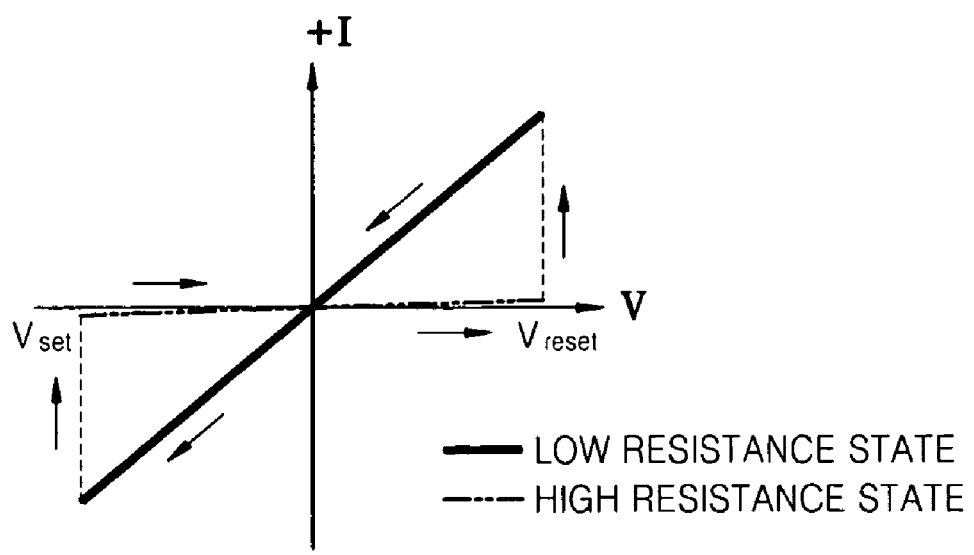
FIG. 3 is a graph showing voltage versus current of a variable resistor disposed in each of the memory cells of the nonvolatile memory device of FIG. 1.
Figure 4:
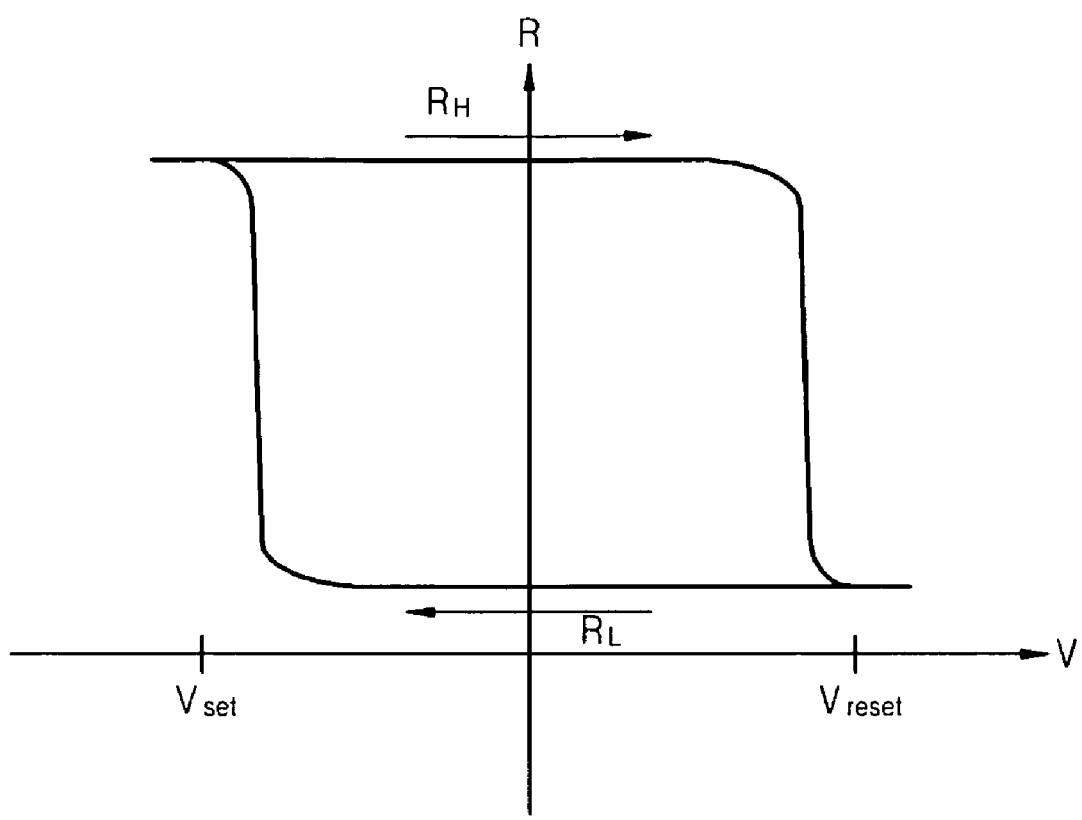
FIG. 4 is a graph showing voltage versus resistance of the variable resistor disposed in each of the memory cells of the nonvolatile memory device of FIG. 1.

FIG. 3 is a graph showing voltage versus current (VI) characteristics of the variable resistor R disposed in each of the memory cells of the nonvolatile memory device 1 of FIG. 1, and FIG. 4 is a graph showing voltage versus resistance (VR) characteristics of the variable resistor R disposed in each of the memory cells of the nonvolatile memory device 1 of FIG. 1.

Referring to FIGS. 1, 3, and 4, the variable resistor R may be in a high resistance state $R_H$ in which a very small amount of current flows through the variable resistor R, or a low resistance state $R_L$ in which a relatively large amount of current flows through the variable resistor R. The resistance state of the variable resistor R is based on the magnitude or direction of voltage applied to the variable resistor R or the magnitude or direction of current flowing through the variable resistor R. When a reset voltage $V_{reset}$ is applied to the variable resistor R, the variable resistor R is may attain the low resistance state $R_L$. The variable resistor R is reset to data '0' from data '1'. When a set voltage $V_{set}$ is applied to the variable resistor R, the variable resistor R may attain the high resistance state $R_H$ from the low resistance state $R_L$. The variable resistor R is set to the data '1' from the data '0'.

In this way, when a voltage greater than the magnitude of the reset voltage $V_{reset}$ is applied to the variable resistor R, an operation of writing the data '0' is performed on the variable resistor R, and when a voltage greater than the magnitude of the set voltage $V_{set}$ is applied to the variable resistor R, an operation of writing the data '1' is performed on the variable resistor R. Thus, a write voltage $V_{WR}$ that is used to perform the operation of writing the data '0' or '1' on the variable resistor R has to be greater than the magnitude of the reset voltage $V_{reset}$ or the magnitude of the set voltage $V_{set}$.

Referring back to FIG. 1, when a write operation is performed on the first memory cell MC1 of the plurality of memory cells MC1, MC2, MC3, MC4, and MC5, a voltage $V_w$ (potential difference) applied to both ends of the first memory cell MC1 has to be greater than or equal to the sum of the threshold voltage $V_{TH}$ of the bidirectional diode D and the write voltage $V_{WR}$ of the variable resistor R. In other words, a minimum voltage $V_w$ that is applied to both ends of the first memory cell MC1 to perform the write operation on the first memory cell MC1 is the sum of the threshold voltage $V_{TH}$ of the bidirectional diode D and the write voltage $V_{WR}$ of the variable resistor R (that is, $V_w=V_{TH}+V_{WR}$). The threshold voltage $V_{TH}$ of the bidirectional diode D may be the first threshold voltage $V_{THp}$ or the second threshold voltage $V_{THn}$ according to a direction in which current that flows through the first memory cell MC1.

In order to apply the voltage $V_w$ to both ends of the first memory cell MC1, a given voltage has to be applied to the third word line WL3 and the second bit line BL2 connected to the first memory cell MC1. For example, 0 V may be applied to the third word line WL3 and the voltage $V_w$ may be applied to the second bit line BL2, or the voltage $V_w$ may be applied to the third word line WL3 and 0 V may be applied to the second bit line BL2. Alternatively, a voltage $+\frac{1}{2}V_w$ may be applied to the third word line WL3 and a voltage $-\frac{1}{2}V_w$ may be applied to the second bit line BL2, or the voltage $-\frac{1}{2}V_w$ may be applied to the third word line WL3 and the voltage $+\frac{1}{2}V_w$ may be applied to the second bit line BL2.

Although the write operation is not performed on the adjacent second memory cell MC2 that is connected to the third word line WL3, a leakage current may be generated due to a voltage applied to the third word line WL3. Thus, voltage applied to the third bit line BL3 connected to the second memory cell MC2 is controlled so that a potential difference across the second memory cell MC2 may be less than the threshold voltage of the bidirectional diode D of the second memory cell MC2 (that is, $\Delta V<V_{TH}$).

Similarly, although the write operation is not performed on the adjacent third memory cell MC3 that is connected to the second bit line BL2, a leakage current may be generated due to a voltage applied to the second bit line BL2. Thus, voltage applied to the fourth word line WL4 connected to the third memory cell MC3 is controlled so that a potential difference across the third memory cell MC3 may be less than the threshold voltage of the bidirectional diode D of the third memory cell MC3 (that is, $\Delta V<V_{TH}$).

Meanwhile, a difference between voltages applied to both ends of, for example, the fifth memory cell MC5 has to be about 0 so that a leakage current may not be generated in the fifth memory cell MC5 that is not connected to the third word line WL3 and the second bit line BL2 (that is, $\Delta V=0$).

Figure 5:
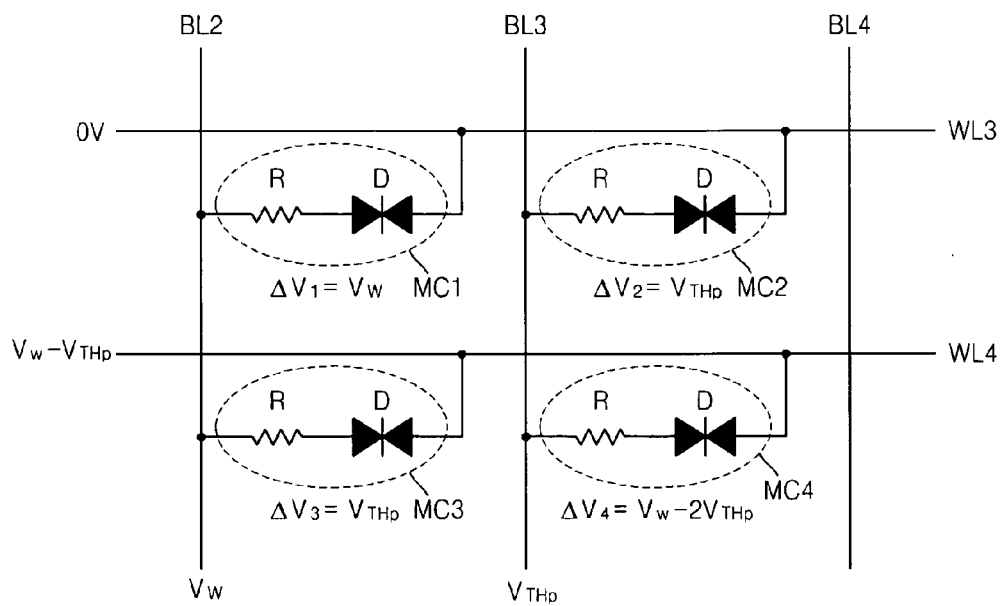
FIG. 5 is a circuit diagram of a region indicated by a dotted line in the nonvolatile memory device of FIG. 1, illustrating an example write operation that is performed on a memory cell on a first voltage condition.

FIG. 5 is a circuit diagram of a region indicated by a dotted line in the nonvolatile memory device 1 of FIG. 1, illustrating a write operation performed on a memory cell in a first voltage condition. FIG. 5 illustrates first through fourth memory cells MC1, MC2, MC3, and MC4 of the nonvolatile memory device 1 of FIG. 1 that are disposed in regions in which the third and fourth word lines WL3 and WL4 and the second and third bit lines BL2 and BL3 intersect one another. The first memory cell MC1 is a memory cell that is selected so that the write operation may be performed on the first memory cell MC1, and a potential difference $\Delta V_1$ across the first memory cell MC1 may be greater than or equal to the write voltage V. The write voltage $V_W$ corresponds to the sum of the threshold voltage $V_{TH}$ of the bidirectional diode D and the write voltage $V_{WR}$ of the variable resistor R. The threshold voltage of the bidirectional diode D may be the first threshold voltage $V_{THP}$ or the second threshold voltage $V_{THn}$ according to a direction in which current flows through the first memory cell MC1.

During a write operation of the first memory cell MC1, in the first voltage condition, a voltage higher than voltage applied to the third word line WL3 is applied to the second bit line BL2 connected to the first memory cell MC1. For example, $V_w$ may be applied to the second bit line BL2, and 0 V may be applied to the third word line WL3. Here, current may flow through the first memory cell MC1 in the forward direction from the second bit line BL2 to the third word line WL3. Thus, the threshold voltage of the bidirectional diode D may be the first threshold voltage $V_{THp}$, and the potential difference $\Delta V_1$ across the first memory cell MC1 is equal to the write voltage $V_w$ (sum of the first threshold voltage $V_{THp}$ of the bidirectional diode D and the write voltage $V_{WR}$ of the variable resistor R, $\Delta V_1=V_w=V_{THp}+V_{WR}$).

A potential difference across each of the second through fourth memory cells MC2, MC3, and MC4, which are adjacent to the first memory cell MC1 and in which the write operation is not performed, is controlled so that a leakage current may not flow through the second through fourth memory cells MC2, MC3, and MC4. In other words, the potential difference across each of the second through fourth memory cells MC2, MC3, and MC4 is controlled to be less than or equal to the threshold voltage of the bidirectional diode D included in the second through fourth memory cells MC2, MC3, and MC4 and, as a result, a leakage current may not flow through the second through fourth memory cells MC2, MC3, and MC4. Hereinafter, an operation of controlling the potential difference across the second through fourth memory cells MC2, MC3, and MC4 is described.

First, a potential difference $\Delta V_2$ across the second memory cell MC2 is controlled to be less than or equal to the threshold voltage of the bidirectional diode D so that a leakage current may not flow through the second memory cell MC2. Since voltage applied to the third word line WL3 is 0 V, current may flow through the second memory cell MC2 in the forward direction from the third bit line BL3 to the third word line WL3. Thus, the potential difference $\Delta V_2$ across the second memory cell MC2 has to be less than or equal to the first threshold voltage $V_{THp}$ of the bidirectional diode D in the forward direction. Thus, voltage applied to the third bit line BL3 is first threshold voltage $V_{THp}$, and the potential difference $\Delta V_2$ across the second memory cell MC2 is the first threshold voltage $V_{THp}$ (that is, $\Delta V_2 = V_{THp}$).

Next, a potential difference $\Delta_3$ across the third memory cell MC3 is controlled to be less than or equal to the threshold voltage of the bidirectional diode D so that a leakage current may not flow through the third memory cell MC3. Since the voltage applied to the second bit line BL2 is $V_w$, current may flow through the third memory cell MC3 in the forward direction from the second bit line BL2 to the fourth word line WL4. Thus, the potential difference $\Delta V_3$ across the third memory cell MC3 has to be less than or equal to the first threshold voltage $V_{THp}$ of the bidirectional diode D in the forward direction. Thus, voltage applied to the fourth word line WL4 is a minimal voltage $(V_w - V_{THp})$ and the potential difference $\Delta V_3$ across of the third memory cell MC3 is equal to the first threshold voltage $V_{THp}$ (that is, $\Delta V_3 = V_{THp}$).

Next, a potential difference $\Delta V_4$ across the fourth memory cell MC4 is controlled to be less than or equal to the threshold voltage of the bidirectional diode D so that the leakage current may not flow through the fourth memory cell MC4. Since the voltage applied to the fourth word line WL4 is voltage $(V_w - V_{THp})$ and the voltage applied to the third bit line BL3 is $V_{THp}$, a reverse current may flow through the fourth memory cell MC4 from the fourth word line WL4 to the third bit line BL3. Thus, the potential difference $\Delta V_4$ across the fourth memory cell MC4 has to be less than the magnitude of the second threshold voltage $V_{THp}$ of the bidirectional diode D in the reverse direction.

Thus, the potential difference $\Delta V_4$ $(V_w - 2V_{THp})$ across the fourth memory cell MC4 has to be less than the magnitude of the second threshold voltage $V_{THn}$ (that is, $\Delta 4 < |V_{THp}|$). Since the write voltage $V_w$ is equal to the sum of the first threshold voltage $V_{THp}$ of the bidirectional diode D and the write voltage $V_{WR}$ of the variable resistor R, $\Delta V_4 = V_w - 2V_{THp} = (V_{THp} + V_{WR}) - 2V_{THp} = V_{WR} - V_{THp} < |V_{THp}|$. Thus, the write voltage $V_{WR}$ of the variable resistor R has to be less than the sum of the magnitude of the first threshold voltage $V_{THp}$, and the magnitude of the second threshold voltage $V_{THn}$ (that is, $V_{WR} < |V_{THp}| + |V_{THp}|$).

Figure 6:
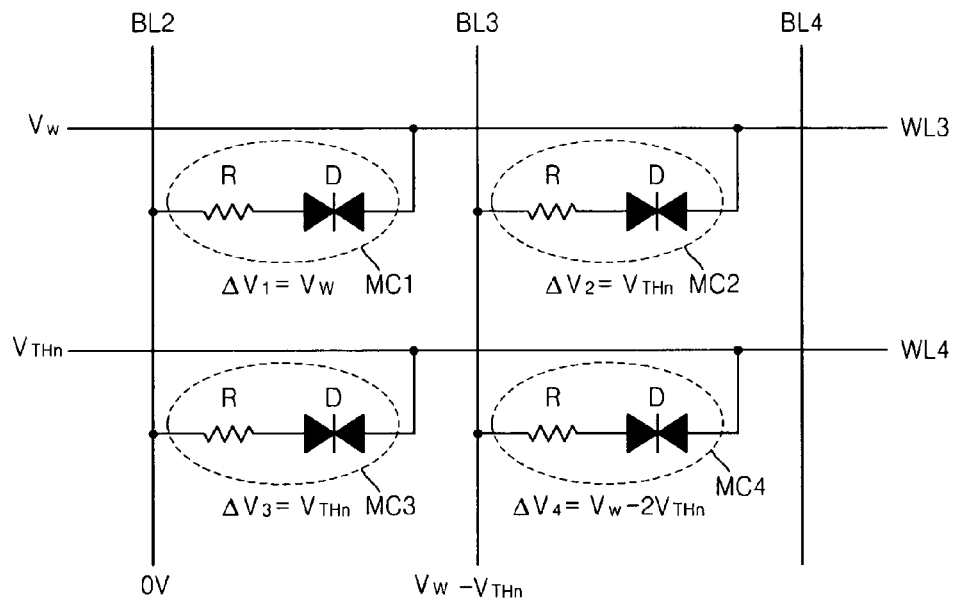
FIG. 6 is a circuit diagram of a region indicated by a dotted line in the example nonvolatile memory device of FIG. 1, illustrating an example write operation that is performed on a memory cell on a second voltage condition.

FIG. 6 is a circuit diagram, according to example embodiments, of a region indicated by a dotted line in the nonvolatile memory device 1 of FIG. 1, illustrating a write operation that is performed on a memory cell on a second voltage condition. FIG. 6 illustrates the first through fourth memory cells MC1, MC2, MC3, and MC4 of the nonvolatile memory device 1 that are disposed in regions in which the third and fourth word lines WL3 and WL4 and the second and third bit lines BL2 and BL3 intersect. The first memory cell MC1 is selected to perform the write operation, and a potential difference $\Delta V_1$ across the first memory cell MC1 is greater than or equal to the write voltage $V_w$. The write voltage $V_w$ corresponds to the sum of the threshold voltage $V_{TH}$ of the bidirectional diode D and the write voltage $V_{WR}$ of the variable resistor R, and the threshold voltage applied to the bidirectional diode D may be the first threshold voltage $V_{THp}$ or the second threshold voltage $V_{THn}$ according to a direction in which current flows through the first memory cell MC1.

In the second voltage condition, a voltage higher than voltage applied to the second bit line BL2 is applied to the third word line WL3 that is connected to the first memory cell MC1. For example, $V_w$ may be applied to the third word line WL3, and 0 V may be applied to the second bit line BL2. Here, current may flow through the first memory cell MC1 in the reverse direction from the third word line WL3 to the second bit line BL2. Thus, the threshold voltage applied to the bidirectional diode D is the second threshold voltage $V_{THn}$, and the potential difference $\Delta V_1$ across the first memory cell MC1 is equal to the write voltage $V_w$. The write voltage $V_w$ corresponds to a sum of the second threshold voltage $V_{THp}$ of the bidirectional diode D and the write voltage $V_{WR}$ of the variable resistor R (that is, $\Delta V_1 = V_w = V_{THn} + V_{WR}$).

In this case, the potential difference across the second through fourth memory cells MC2, MC3, and MC4 is controlled so that a leakage current may not flow through the second through fourth memory cells MC2, MC3, and MC4. As is seen, the second through fourth memory cells MC2, MC3, and MC4 are adjacent to the first memory cell MC1 and the write operation is not performed on them. In other words, the potential difference across the second through fourth memory cells MC2, MC3, and MC4 may be less than or equal to the threshold voltage of the bidirectional diode D included in each of the second through fourth memory cells MC2, MC3, and MC4 and a leakage current may not flow through each of the second through fourth memory cells MC2, MC3, and MC4. Hereinafter, an operation of controlling the potential difference across the second through fourth memory cells MC2, MC3, and MC4 is described.

First, a potential difference $\Delta V_2$ across the second memory cell MC2 is controlled to be less than or equal to the threshold voltage of the bidirectional diode D so that a leakage current may not flow through the second memory cell MC2. Since voltage applied to the third word line WL3 is $V_w$, current may flow through the second memory cell MC2 in the backward direction from the third word line WL3 to the third bit line BL3. Thus, the potential difference $\Delta V_2$ across the second memory cell MC2 has to be less than or equal to the threshold voltage $V_{THn}$ applied to the bidirectional diode D in the reverse direction. Thus, voltage of the third bit line BL3 is voltage $(V_w - V_{THn})$, and the potential difference $\Delta V_2$ across the second memory cell MC2 is equal to the second threshold voltage $V_{THn}$ (that is, $\Delta V_2 = V_{THn}$).

Next, a potential difference $\Delta V_3$ across the third memory cell MC3 has to be controlled to be less than or equal to the threshold voltage applied to the third memory cell MC3 so that a leakage current may not flow through the third memory cell MC3. Since the voltage applied to the second bit line BL2 is 0 V, current may flow through the third memory cell MC3 in the reverse direction from the fourth word line WL4 to the second bit line BL2. Thus, the potential difference $\Delta V_3$ across the third memory cell MC3 has to be less than or equal to the second threshold voltage $V_{THn}$ of the bidirectional diode D in the reverse direction. Thus, a magnitude of the voltage applied to the fourth word line WL4 is a maximal voltage $V_{THn}$, and the potential difference $\Delta V_3$ across the third memory cell MC3 is equal to the second threshold voltage $V_{THn}$ (that is, $\Delta V_3 = V_{THn}$).

Next, a potential difference $\Delta V_4$ across the fourth memory cell MC4 has to be controlled to be less than or equal to the threshold voltage of the bidirectional diode D so that the leakage current may not flow through the fourth memory cell MC4. Since the voltage applied to the third bit line BL3 is voltage ($V_w-V_{THn}$) and the voltage applied to the fourth word line WL4 is $V_{THn}$, current may flow through the fourth memory cell MC4 in the forward direction from the third bit line BL3 to the fourth word line WL4. Thus, the potential difference $\Delta V_4$ across the fourth memory cell MC4 may be less than the magnitude of the first threshold voltage $V_{THp}$, of the bidirectional diode D in the forward direction.

Thus, the potential difference $\Delta V_4$ ($V_w-2V_{THn}$) across the fourth memory cell MC4 has to be less than the magnitude of the first threshold voltage $V_{THp}$ (that is, $\Delta V_4<|V_{THp}|$). Since the write voltage $V_w$ is equal to the sum of the second threshold voltage $V_{THn}$ of the bidirectional diode D and the write voltage $V_{WR}$ of the variable resistor R, $\Delta V_4=V_w-2V_{THn}=(V_{THn}+V_{WR})-2V_{THn}=V_{WR}-V_{THn}<|V_{THp}|$. Thus, the write voltage $V_{WR}$ of the variable resistor R has to be less than the sum of the magnitude of the first threshold voltage $V_{THp}$ and the magnitude of the second threshold voltage $V_{THn}$ (that is, $V_{WR}<|V_{THp}|+|V_{THn}|$).

As described above, in the nonvolatile memory device 1 including the plurality of memory cells, wherein each of the memory cells includes the bidirectional diode D and the variable resistor R, in order to prevent leakage current, the write voltage $V_{WR}$ of the variable resistor R has to be less than the sum of the magnitude of the first threshold voltage $V_{THp}$, and the magnitude of the second threshold voltage $V_{THn}$ (that is, $V_{WR}<|V_{THp}|+|V_{THn}|$). Thus, when designing the nonvolatile memory device 1, the variable resistor R may be selected according to the write voltage $V_{WR}$ that is obtained based on the first and second threshold voltages $V_{THp}$ and $V_{THn}$ of the bidirectional diode D, and the bidirectional diode D may be selected according to the first and second threshold voltages $V_{THp}$ and $V_{THn}$ that are obtained based on the write voltage $V_{WR}$ of the variable resistor R.

Figure 7:
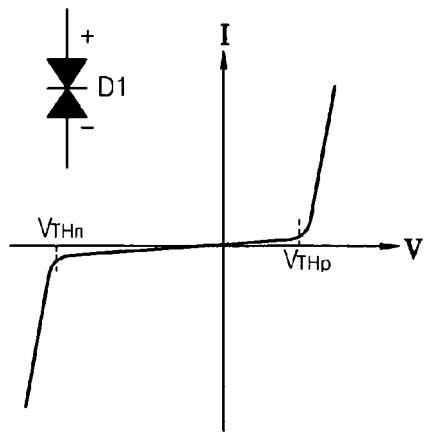
FIG. 7 is a graph showing voltage versus current of a bidirectional diode according to example embodiments.
Figure 8:
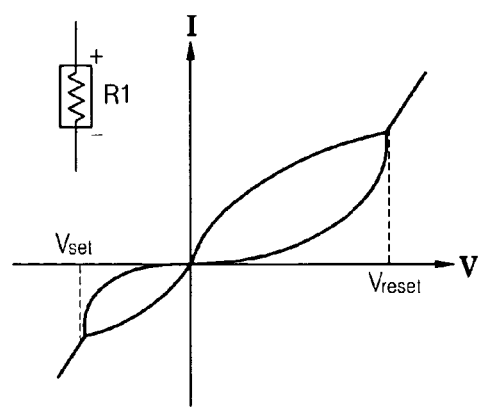
FIG. 8 is a graph showing voltage versus current of a variable resistor according to example embodiments.
Figure 9:
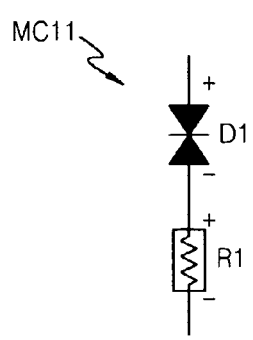
FIG. 9 is a circuit diagram of a memory cell including the bidirectional diode of FIG. 7 and the variable resistor of FIG. 8, according to example embodiments.
Figure 10:
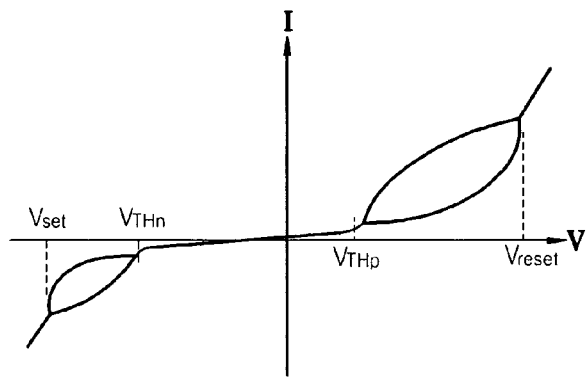
FIG. 10 is a graph showing current versus voltage of the memory cell of FIG. 9.

FIG. 7 is a graph showing voltage versus current (VI) characteristics of a bidirectional diode according to example embodiments. FIG. 8 is a graph showing voltage versus current (VI) characteristics of a variable resistor according to example embodiments. FIG. 9 is a circuit diagram of a memory cell including the bidirectional diode of FIG. 7 and the variable resistor of FIG. 8. FIG. 10 is a graph showing current versus voltage (VI) characteristics of the memory cell of FIG. 9.

Referring to FIGS. 7 through 10, a first bidirectional diode D1 may have a first threshold voltage $V_{THp}$ that is a threshold voltage in case that a forward current flows through the first bidirectional diode D, and a second threshold voltage $V_{THn}$ that is a threshold voltage in case that a reverse current flows through the first bidirectional diode D1, and the magnitude of the first threshold voltage $V_{THp}$ may be less than the magnitude of the second threshold voltage $V_{THn}$. Also, the variable resistor R1 may have a first write voltage $V_{reset}$ and a second write voltage $V_{set}$, and the magnitude of the first write voltage $V_{reset}$ may be greater than the magnitude of the second write voltage $V_{set}$.

In order to perform a write operation on each of memory cells of a memory cell array, voltage having a desired magnitude has to be applied to the memory cell in the forward or reverse direction. In order to write data '0' in the memory cell, the voltage has to be applied to the memory cell in the forward direction. The voltage applied to the memory cell has to be greater than or equal to the sum of the first threshold voltage of the bidirectional diode and the first write voltage of the variable resistor. Also, in order to write data '1' in the memory cell, the voltage has to be applied to the memory cell in the reverse direction. The magnitude of the voltage applied to the memory cell has to be greater than or equal to the sum of the magnitude of the second threshold voltage applied to the bidirectional diode D and the magnitude of the second write voltage applied to the variable resistor R.

Thus, when a memory cell MC11 (FIG. 9) includes a bidirectional diode D1 having the voltage-current characteristic of FIG. 7 and a variable resistor R1 having the voltage-current characteristic of FIG. 8, the bidirectional diode D1 and the variable resistor R1 may be connected to each other in series in a same direction. A series connection of the bidirectional diode D1 and the variable resistor R1 may result in the current-voltage (VI) characteristic curve as shown in FIG. 10.

When the write operation is performed on the memory cell MC11, voltage applied to the memory cell MC11 in the forward direction has to be greater than or equal to the sum of the first threshold voltage $V_{THp}$ (a relatively small value) and the first write voltage $V_{reset}$ (a relatively large value), and voltage applied to the memory cell MC11 in the reverse direction has to be greater than or equal to the sum of the second threshold voltage $V_{THn}$ (a relatively large value) and the second write voltage $V_{set}$ (a relatively small value).

Since the sum of the first threshold voltage $V_{THp}$, and the first write voltage $V_{reset}$ is somewhat similar to the sum of the second threshold voltage $V_{THn}$ and the second write voltage $V_{set}$, the voltage applied to the memory cell MC11 in the forward direction is somewhat similar to the voltage applied to the memory cell MC11 in the reverse direction. Thus, since the write voltage applied to the memory cell MC11 may be reduced, a size of a boosting circuit for boosting voltage may be reduced, and the level of current that flows through the memory cell MC11 may be reduced.

Similarly, even when the magnitude of the first threshold voltage $V_{THp}$ of the bidirectional diode D1 is greater than the magnitude of the second threshold voltage $V_{THn}$ and the magnitude of the first write voltage $V_{reset}$ of the variable resistor R is less than the magnitude of the second write voltage $V_{set}$, the bidirectional diode D1 and the variable resistor R1 may be connected to each other in series in the same direction, as illustrated in FIG. 9.

Figure 11:
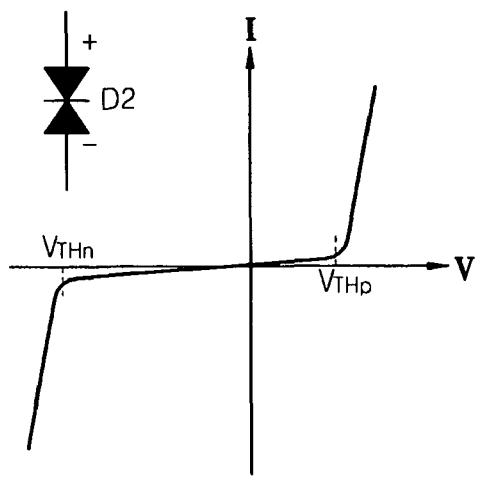
FIG. 11 is a graph showing voltage versus current of a bidirectional diode according to example embodiments.
Figure 12:
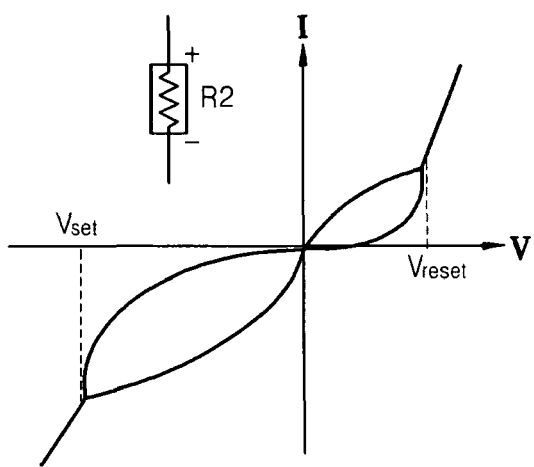
FIG. 12 is a graph showing voltage versus current of a variable resistor according to example embodiments.
Figure 13:
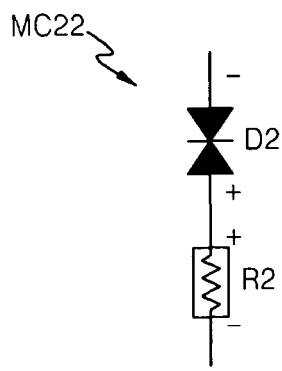
FIG. 13 is a circuit diagram illustrating an connection between the bidirectional diode of FIG. 11 and the variable resistor of FIG. 12, according to example embodiments.

FIG. 11 is a graph showing voltage versus current (VI) characteristics of a bidirectional diode D2 according to example embodiments. FIG. 12 is a graph showing voltage versus current (VI) characteristics of a variable resistor R2 according to example embodiments. FIG. 13 is a circuit diagram illustrating the connection between the bidirectional diode D2 of FIG. 11 and the variable resistor R2 of FIG. 12.

Referring to FIGS. 11 through 13, the bidirectional diode D2 may have a first threshold voltage $V_{THp}$ when a forward current is applied to the bidirectional diode D2 and a second threshold voltage $V_{THn}$ when a reverse current is applied to the bidirectional diode D2, wherein the magnitude of the first threshold voltage $V_{THp}$ may be less than the magnitude of the second threshold voltage $V_{THn}$. Also, the variable resistor R2 may have a first write voltage $V_{reset}$ and a second write voltage $V_{set}$, wherein the magnitude of the first write voltage $V_{reset}$ may be less than the magnitude of the second write voltage $V_{set}$.

When the bidirectional diode D2 having the voltage-current characteristics of FIG. 11 and the variable resistor R2 having the voltage-current characteristics of FIG. 12 constitute a memory cell MC22, the bidirectional diode D2 and the variable resistor R2 may be connected to each other in series in opposite directions, as illustrated in FIG. 13. Such a series connection may result in the current-voltage characteristic curve of the memory cell MC22 as shown in FIG. 10.

When a write operation is performed on the memory cell MC22, a forward voltage applied to the memory cell MC22 has to be greater than or equal to the sum of the second threshold voltage $V_{THn}$ (a relatively large value) and the first write voltage $V_{reset}$ (a relatively small value), and a reverse voltage applied to the memory cell MC22 has to be greater than or equal to the sum of the first threshold voltage $V_{THp}$ (a relatively small value) and the second write voltage $V_{set}$ (a relatively large value). Since the sum of the second threshold voltage $V_{THn}$ and the first write voltage $V_{reset}$ is somewhat similar to the sum of the first threshold voltage $V_{THp}$ and the second threshold voltage $V_{set}$, the forward voltage applied to the memory cell MC22 is somewhat similar to the reverse voltage applied to the memory cell MC22. Thus, since the write voltage applied to the memory cell MC22 may be reduced, the size of a boosting circuit for boosting voltage may be reduced, and the level of current that flows through the memory cell MC22 may be reduced.

Similarly, even when the magnitude of the first threshold voltage $V_{THp}$ of the bidirectional diode D2 is greater than the magnitude of the second threshold voltage $V_{THn}$ and the magnitude of the first write voltage $V_{reset}$ of the variable resistor R2 is greater than the magnitude of the second write voltage $V_{set}$, the bidirectional diode D2 and the variable resistor R2 may be connected to each other in series in opposite directions and may constitute the memory cell MC22, as illustrated in FIG. 13.

Figure 14:
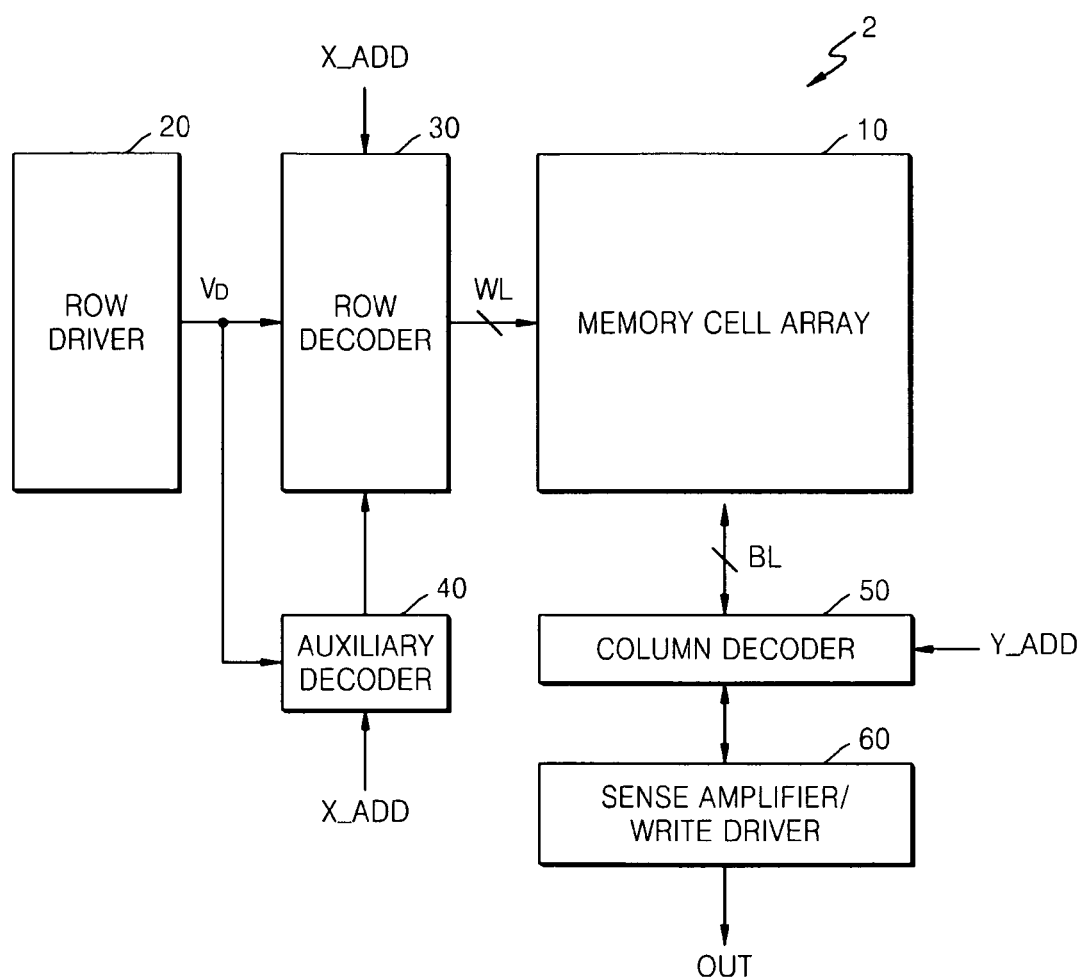
FIG. 14 is a block diagram of a nonvolatile memory device according to example embodiments.

FIG. 14 is a block diagram of a nonvolatile memory device 2 according to example embodiments. Referring to FIG. 14, the nonvolatile memory device 2 may include a memory cell array 10, a row driver 20, a row decoder 30, an auxiliary decoder 40, a column decoder 50, and a sense amplifier/write driver 60.

The memory cell array 10 may include a plurality of word lines, a plurality of bit lines, and a plurality of memory cells disposed in a region in which the plurality of word lines and the plurality of bit lines intersect. The plurality of memory cells may include the bidirectional diode D and the variable resistor R, as illustrated in FIG. 1. The plurality of word lines may include a plurality of main word lines and a plurality of sub-word lines.

The row driver 20 may generate a driving voltage $V_D$ that is applied to the plurality of word lines of the memory cell array 10. The row decoder 30 may decode a desired bit value of a row address X_ADD into a first address signal that corresponds to the plurality of main word lines to activate at least one of the main word lines. The auxiliary decoder 40 may decode the remaining bit value of the row address X_ADD into a second address signal that corresponds to the plurality of sub-word lines to activate at least one of the sub-word lines. The main word lines may correspond to global word lines, and the sub-word lines may correspond to local word lines. Alternatively, the nonvolatile memory device 2 may not include the auxiliary decoder 40, and the row decoder 30 may decode the row address X_ADD into an address signal that corresponds to the plurality of word lines.

The column decoder 50 may decode a column address Y_ADD to select at least one bit line that corresponds to the column address Y_ADD. The sense amplifier/write driver 60 may receive data from the memory cells of the memory cell array 10 and may perform a read operation on the memory cells of the memory cell array 10, or may supply voltage to the plurality of bit lines of the memory cell array 10 and may perform a write operation on the memory cells of the memory cell array 10.

Figure 15:
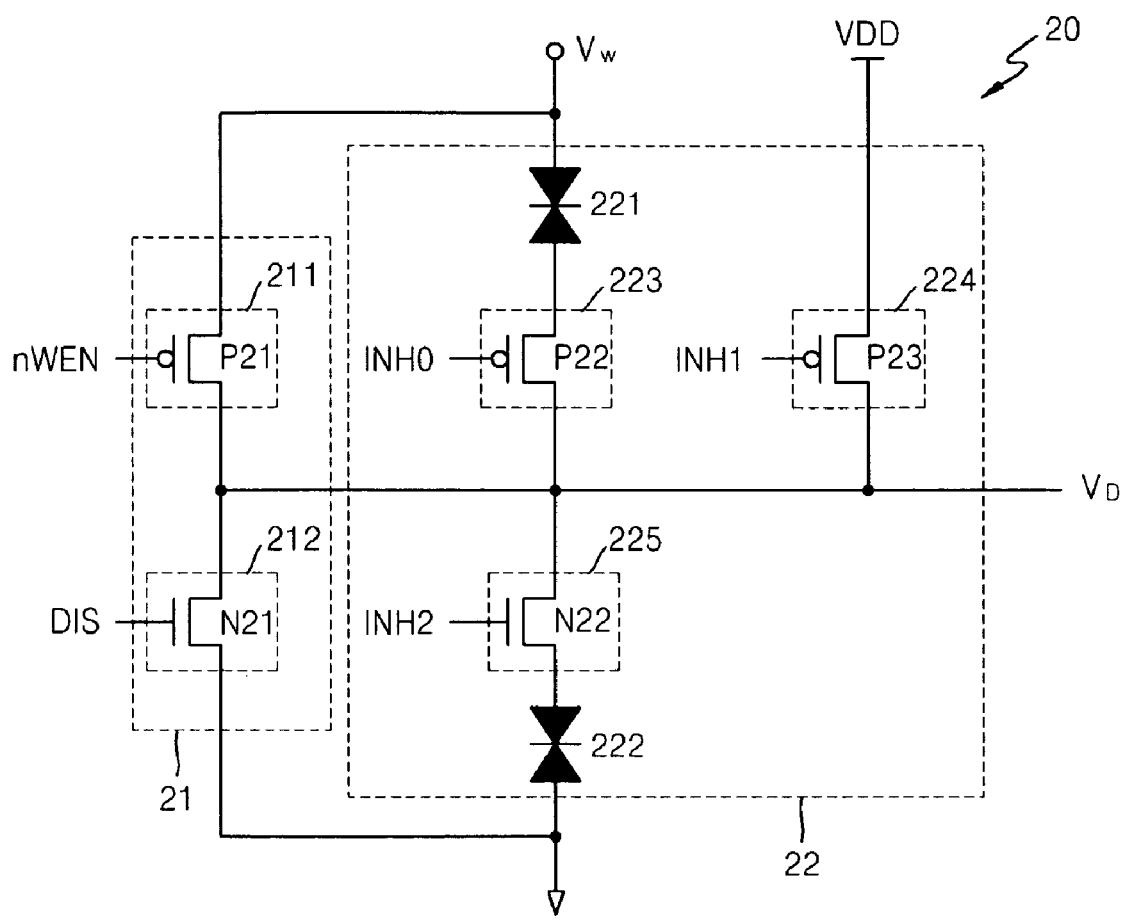
FIG. 15 is a block diagram of a row driver of FIG. 14 according to example embodiments.

FIG. 15 is a block diagram of the row driver 20 of FIG. 14, according to example embodiments. Referring to FIG. 15, the row driver 20 may include a first driver 21 for supplying a driving voltage to a memory cell of the plurality of memory cells in which a write operation is performed, and a second driver 22 for supplying a driving voltage to a memory cell of the plurality of memory cells in which the write operation is not performed.

The first driver 21 may supply a write voltage or a ground voltage to the plurality of word lines based on a write enable signal WEN and a discharge signal DIS, and may include a write voltage supplying unit 211 and a ground voltage supplying unit 212.

The write voltage supplying unit 211 may supply a write voltage $V_w$ to the word lines when the write enable signal WEN is activated. For example, the write voltage supplying unit 211 may include a first PMOS transistor P21, and the first PMOS transistor P21 may have a source connected to a write voltage terminal to which the write voltage $V_w$ is applied, and a gate to which an inverted write enable signal nWEN is applied. When the write enable signal WEN is activated, i.e., when the inverted write enable signal nWEN is at a logic 'low' level, the first PMOS transistor P21 may be turned on and may supply the write voltage $V_w$ to the word lines.

The ground voltage supplying unit 212 may supply a ground voltage to the word lines when the discharge signal DIS is activated. For example, the ground voltage supplying unit 212 may include a first NMOS transistor N21, and the first NMOS transistor N21 may have a drain connected to a drain of the first PMOS transistor P21, a gate to which the discharge signal DIS is applied, and a source connected to a ground voltage terminal to which the ground voltage is applied. When the discharge signal DIS is activated, i.e., when the discharge signal DIS is at a logic 'high' level, the first NMOS transistor N21 may be turned on and may supply the ground voltage to the word lines.

The second driver 22 that supplies a inhibit voltage to the word lines based on a plurality of inhibit signals INH0, INH1, and INH2 and may include first and second replica elements 221 and 222 corresponding to the bidirectional diode D, a first inhibit voltage supplying unit 223, a second inhibit voltage supplying unit 224, and a third inhibit voltage supplying unit 225.

The first replica element 221 corresponding to the bidirectional diode D of a memory cell of the memory cell array 10 may be connected to a write voltage terminal. The second replica element 222 corresponding to the bidirectional diode D of the memory cell of the memory cell array 10 may be connected to a ground voltage terminal. Due to a variation of temperature, pressure or process, for example, a magnitude of a threshold voltage of the bidirectional diode D of the memory cell of the memory cell array 10 may vary. Accordingly, the first and second replica elements 221 and 222 corresponding to the bidirectional diode D may be included outside the memory cell array 10, for example, in the row driver 20 so that the amount of a change of the threshold voltage of the bidirectional diode D included in the memory cell array 10 may be corrected.

The first inhibit voltage supplying unit 223 may supply a first inhibit voltage to the memory cell of the memory cell array 10 when the first inhibit signal INH0 is activated. For example, the first inhibit voltage supplying unit 223 may include a second PMOS transistor P22, and the second PMOS transistor P22 may have a source connected to the first replica element 221 and a gate to which the first inhibit signal INH0 is applied. When the first inhibit signal INH0 is activated (for example, logic 'low' level), the second PMOS transistor P22 may turn on and may supply a voltage corresponding to a voltage obtained by subtracting a threshold voltage $V_{TH}$ of the first replica element 221 from the write voltage $V_w$ ($V_w-V_{TH}$) as the first inhibit voltage to the memory cell of the memory cell array 10.

The second inhibit voltage supplying unit 224 may supply a second inhibit voltage to the memory cell of the memory cell array 10 when the second inhibit signal INH1 is activated. For example, the second inhibit voltage supplying unit 224 may include a third PMOS transistor P23, and the third PMOS transistor P23 may have a source connected to a power supply voltage terminal to which the power supply voltage VDD is applied, and a gate to which the second inhibit signal INH1 is applied. When the second inhibit signal INH0 is activated (for example, logic 'low' level) the third PMOS transistor P23 may be turned on and may supply the power supply voltage VDD as the second inhibit voltage to the memory cell of the memory cell array 10.

The third inhibit voltage supplying unit 225 may supply a third inhibit voltage to the memory cell of the memory cell array 10 when the third inhibit signal INH2 is activated. For example, the third inhibit voltage supplying unit 225 may include a second NMOS transistor N22, and the second NMOS transistor N22 may have a drain connected to the drain of the second PMOS transistor P22, a gate to which the third inhibit signal INH2 is applied, and a source connected to the second replica element 222. When the third inhibit signal INH2 is activated (for example, logic 'high' level) the second NMOS transistor N22 may be turned on and may supply a threshold voltage $V_{TH}$ of the second replica element 222 as the third inhibit voltage to the memory cell of the memory cell array 10.

According to the example embodiments of FIG. 15, the row driver 20 includes the first driver 21 that supplies the write voltage or the ground voltage and the second driver 22 that supplies first through third inhibit voltages. Thus, the row driver 20 may not include a voltage generator that generates the first through third inhibit voltages and, as a result, the area of the nonvolatile memory device 1 of FIG. 14 may be reduced.

Also, the second driver 22 of the row driver 20 includes first and second replica elements 221 and 222 corresponding to the bidirectional diode D included in the memory cell array 10, thereby supplying the first and third inhibit voltages that are generated based on the threshold voltages $V_{TH}$ of the first and second replica elements 221 and 222 to the memory cell array 10. As such, the memory cell array 10 receives an inhibit voltage that is corrected based on the threshold voltages $V_{TH}$ of the first and second replica elements 221 and 222, thereby reducing a leakage current or noise that may occur in the memory cells due to a change of the threshold voltage of the bidirectional diode D included in the memory cell array 10.

In other words, due to a change of the threshold voltage of the bidirectional diode of the memory cell array 10, the leakage current may flow through the memory cell of the memory cell array 10 in which the write operation does not have to be performed. The row driver 20 may supply a inhibit voltage (e.g., $V_W-V_{TH}$ or $V_{TH}$) that is corrected based on the change of the threshold voltages $V_{TH}$ by using the first and second replica elements 221 and 222 with respect to the bidirectional diode D. As such, the inhibit voltage applied to the memory cell of the memory cell array 10 in which the write operation does not have to be performed, may be reduced by the threshold voltage $V_{TH}$ of the first replica element 221 or may be increased by the threshold voltage $V_{TH}$ of the second replica element 222. Thus, in the memory cells of the memory cell array 10 in which the write operation does not have to be performed, although the threshold voltage of the bidirectional diode D included in the memory cells is varied, the inhibit voltage is also varied so that the leakage current or noise may not occur.

Figure 16:
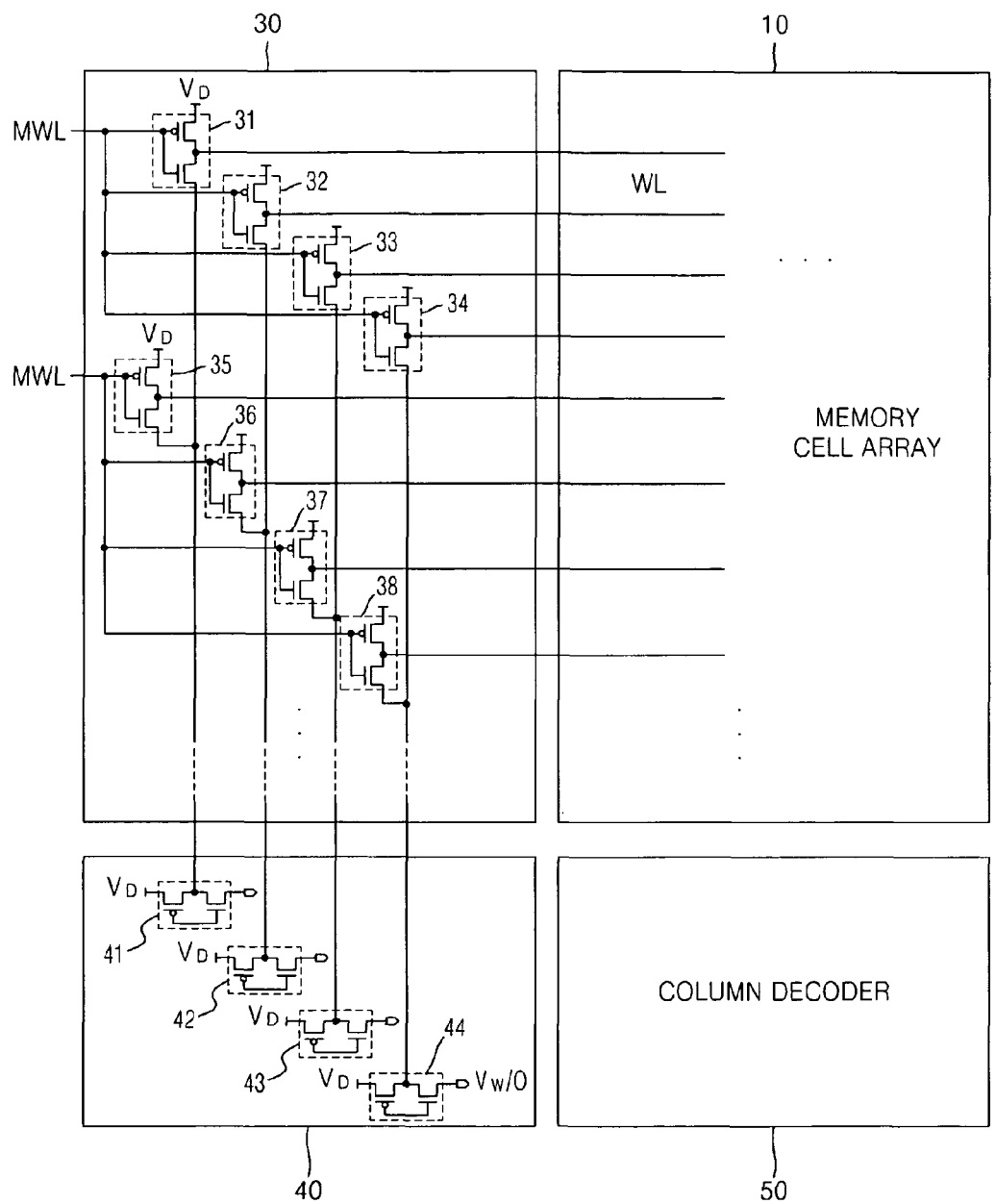
FIG. 16 is a circuit diagram of a row decoder and an auxiliary decoder of FIG. 14 according to example embodiments.

FIG. 16 is a circuit diagram of the row decoder 30 and the auxiliary decoder 40 of FIG. 14 according to example embodiments. Referring to FIG. 16, the row decoder 30 may encode a desired bit value of a row address X_ADD into a first address signal corresponding to main word lines MWL and may include first through eighth transmission units 31 to 38. When the first address signal is at the logic 'low' level, the first through eighth transmission units 31 to 38 may supply a driving voltage VD that is supplied by the row driver 20 to sub-word lines WL. Meanwhile, when the first address signal is at the logic 'high' level, the first through eighth transmission units 31 to 38 may supply voltage that is supplied by the auxiliary decoder 40 to the sub-word lines WL.

The auxiliary decoder 40 may decode the remaining bit value (for example, bit values not encoded by the row decoder 30) of the row address X_ADD into a second address signal corresponding to the sub-word lines WL and may include ninth through twelfth transmission units 41, 42, 43, and 44. When the second address signal is at the logic 'low' level, the ninth through twelfth transmission units 41, 42, 43, and 44 may supply the driving voltage VD that is supplied by the row driver 20. Meanwhile, when the second address signal is at the logic 'high' level, the ninth through twelfth transmission units 41, 42, 43, and 44 may supply the write voltage Vw or the ground voltage 0 V. As such, since the forward or reverse voltage may be applied to each memory cell of the memory cell array 10, an operation of writing data '0' or '1' may be performed on each memory cell.

The first through eighth transmission units 31 to 38 included in the row decoder 30 may include a replica element corresponding to the bidirectional diode D included in the memory cell array 10. The ninth through twelfth transmission units 41, 42, 43, and 44 included in the auxiliary decoder 40 may also include the replica element corresponding to the bidirectional diode D included in the memory cell array 10. Thus, the occurrence of the leakage current or noise due to the change of the threshold voltage of the bidirectional diode D included in the memory cell array 10 may be prevented.

Figure 17:
FIG. 17 is a block diagram of a nonvolatile memory device according to example embodiments.

FIG. 17 is a block diagram of a nonvolatile memory device 100 according to example embodiments. Referring to FIG. 17, the nonvolatile memory device 100 may include a memory core unit 110 and a peripheral circuit unit 120. The memory core unit 110 may include a plurality of memory cell arrays MCA 111, a plurality of row decoders X-DEC 112, a plurality of column decoders Y-DEC 113, a plurality of sense amplifiers S/A/write drivers W/D 114, and a main row decoder 115. The peripheral circuit unit 120 may include the row driver 20 of FIG. 15.

Thus, the peripheral circuit unit 120 includes a replica element corresponding to the bidirectional diode D included in the memory cell arrays MCA 111, thereby correcting the amount of a change of the threshold voltage of the bidirectional diode D included in the memory cell arrays MCA 111. Alternatively, the plurality of column decoders Y-DEC 113 or the plurality of sense amplifiers S/A/write drivers W/D 114 may include the replica element corresponding to the bidirectional diode D included in the memory cell arrays MCA 111.

Figure 18:
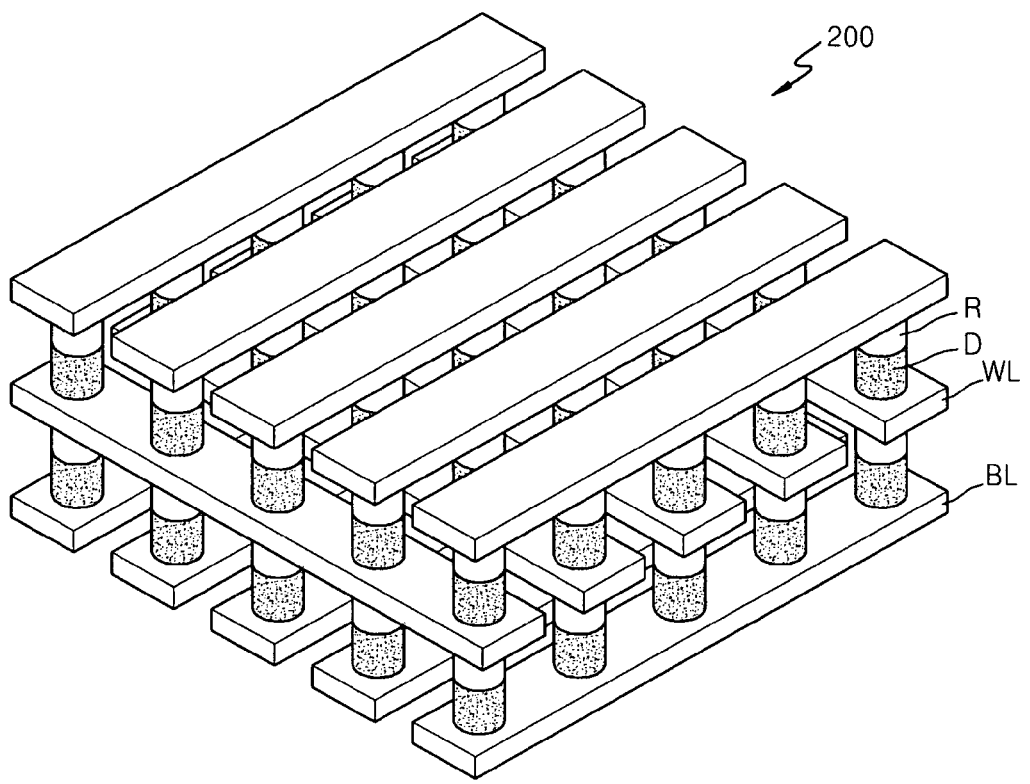
FIG. 18 is a perspective view of a nonvolatile memory device according to example embodiments.

FIG. 18 is a perspective view of a nonvolatile memory device 200 according to example embodiments. Referring to FIG. 18, the nonvolatile memory device 200 may include a plurality of bit lines BL, a plurality of word lines WL, and a plurality of memory cells. The plurality of bit lines BL may be disposed to intersect the plurality of word lines WL. Each of the plurality of memory cells may be disposed in a region in which the bit lines BL and the word lines WL intersect one another, and may include a bidirectional diode D and a variable resistor R.

Figure 19:
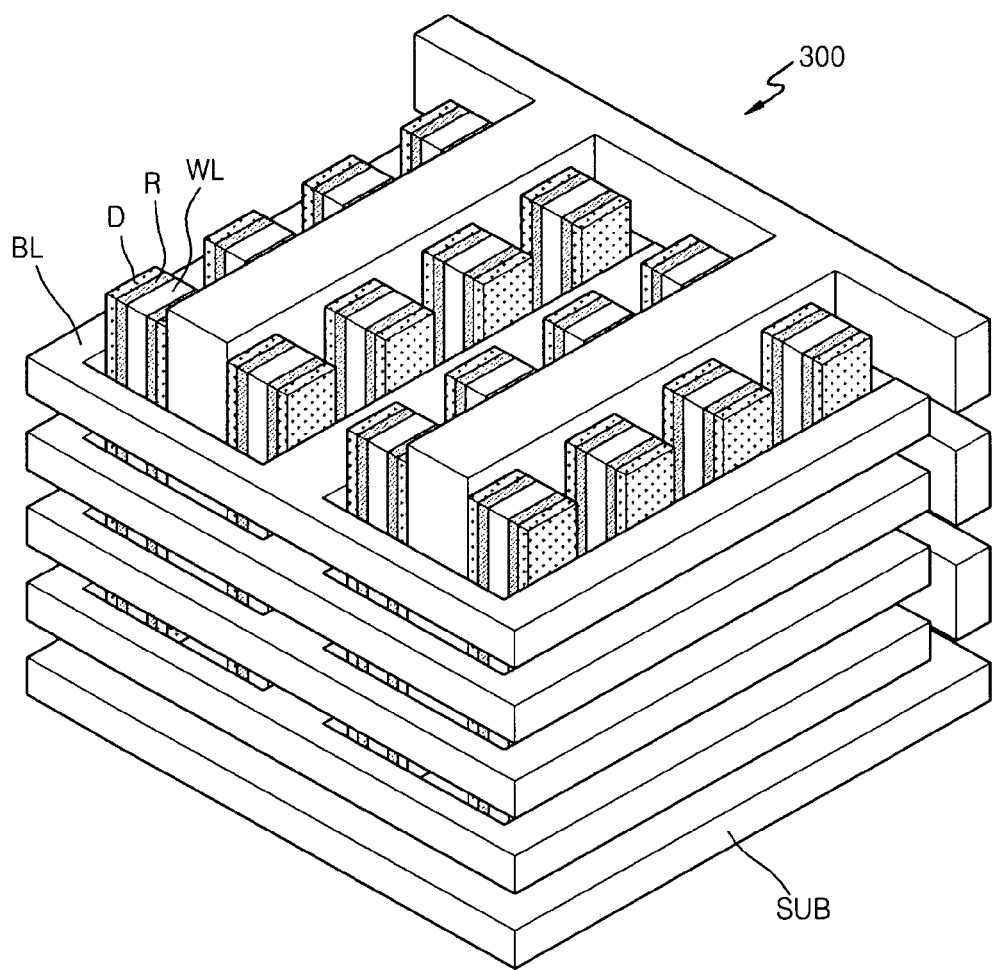
FIG. 19 is a perspective view of a nonvolatile memory device according to example embodiments.

FIG. 19 is a perspective view of a nonvolatile memory device 300 according to example embodiments. Referring to FIG. 19, the nonvolatile memory device 300 may include a plurality of bit lines BL disposed in parallel to a substrate SUB, a plurality of word lines WL disposed perpendicular to the substrate SUB, and a plurality of memory cells disposed between the bit lines BL and the word lines WL. Each of the memory cells may include a diode material D and a variable resistor material R, which are formed perpendicular to the substrate SUB. The variable resistor material R may be, for example, amorphous silicon doped with vanadium (V), cobalt (Co), nickel (Ni), palladium (Pd), iron (Fe) or manganese (Mn) or a perovskite material, such as Pr1-xCaxMnO3, La1-xCaxMnO$_3$(LCMO), LaSrMnO3(LSMO) or GdBaCox-Oy(GBCO).

Figure 20:
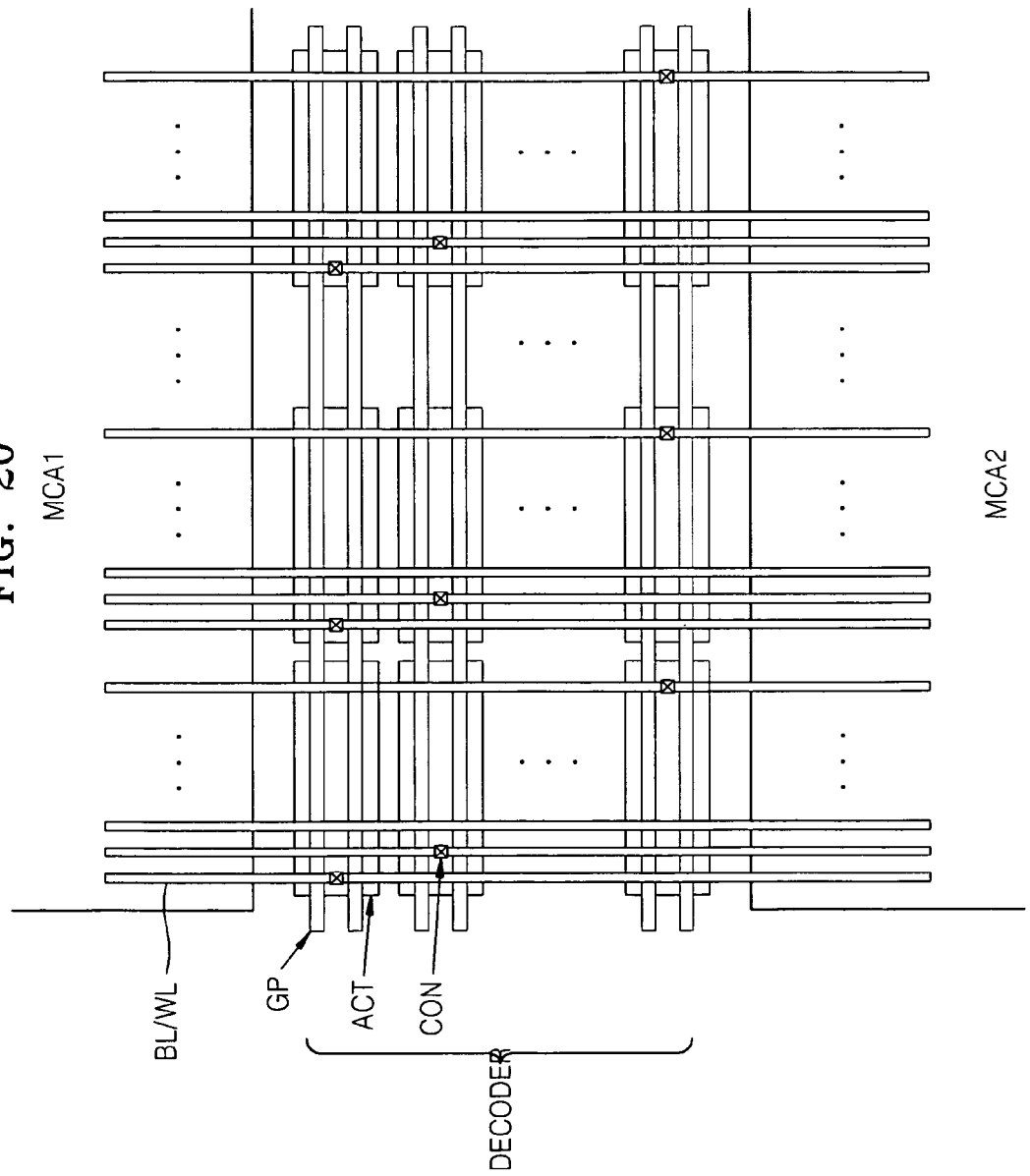
FIG. 20 is a plan view of a nonvolatile memory device according to example embodiments.

FIG. 20 is a plan view of a nonvolatile memory device according to example embodiments. Referring to FIG. 20, a decoder that is commonly connected to first and second memory cell arrays MCA1 and MCA2 may be disposed in a layer other than the layers of the first and second memory cell arrays MCA1 and MCA2. For example, the first and second memory cell arrays MCA1 and MCA2 may be disposed in upper layers of the nonvolatile memory device, and the decoder may be disposed in a lower layer of the nonvolatile memory device so that the area of the nonvolatile memory device may be reduced. Alternatively, the decoder may be disposed in an upper layer of the nonvolatile memory device, or the first and second memory cell arrays MCA1 and MCA2 may be disposed in lower layers of the nonvolatile memory device.

A gate electrode GP is disposed on an active region ACT of the decoder, and a source/drain region may be formed on both sides of the gate electrode GP. The source/drain region may be connected to a plurality of bit lines or a plurality of word lines of the first and second memory cell arrays MCA1 and MCA2 via a contact CON.

Figure 21:
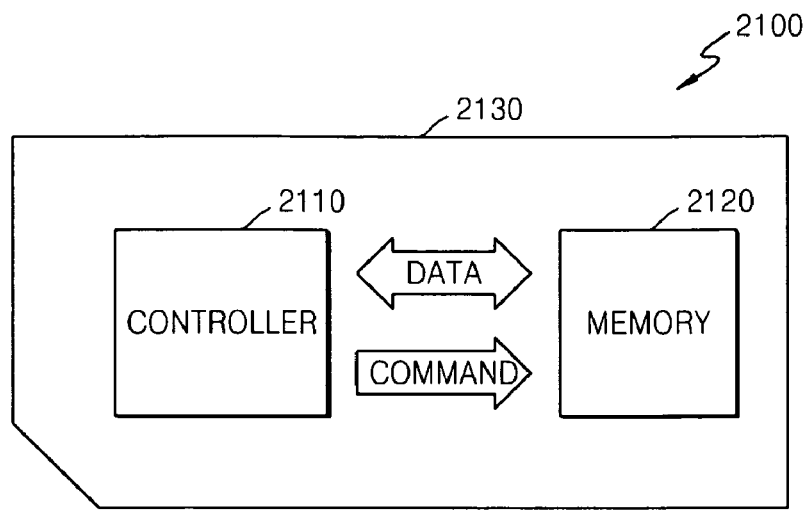
FIG. 21 is a block diagram of a memory card according to example embodiments.

FIG. 21 is a block diagram of a memory card 2100 according to example embodiments. Referring to FIG. 21, the memory card 2100 may include a controller 2110 and a memory unit 2120, which are disposed in a housing 2130, wherein the controller 2110 and the memory unit 2120 may exchange electrical signals. For example, the memory unit 2120 and the controller 2110 may exchange data based on a command from the controller 2110. Thus, the memory card 2100 may store data in the memory unit 2120 or may output the data from the memory unit 2120 to an external device.

For example, the memory unit 2100 may include any one of the nonvolatile memory devices according to example embodiments of FIGS. 1 through 20. The memory card 2100 may be used as a data storage medium for various mobile devices. For example, the memory card 2100 may include a multimedia card (MMC) or a secure digital (SD) card.

Figure 22:
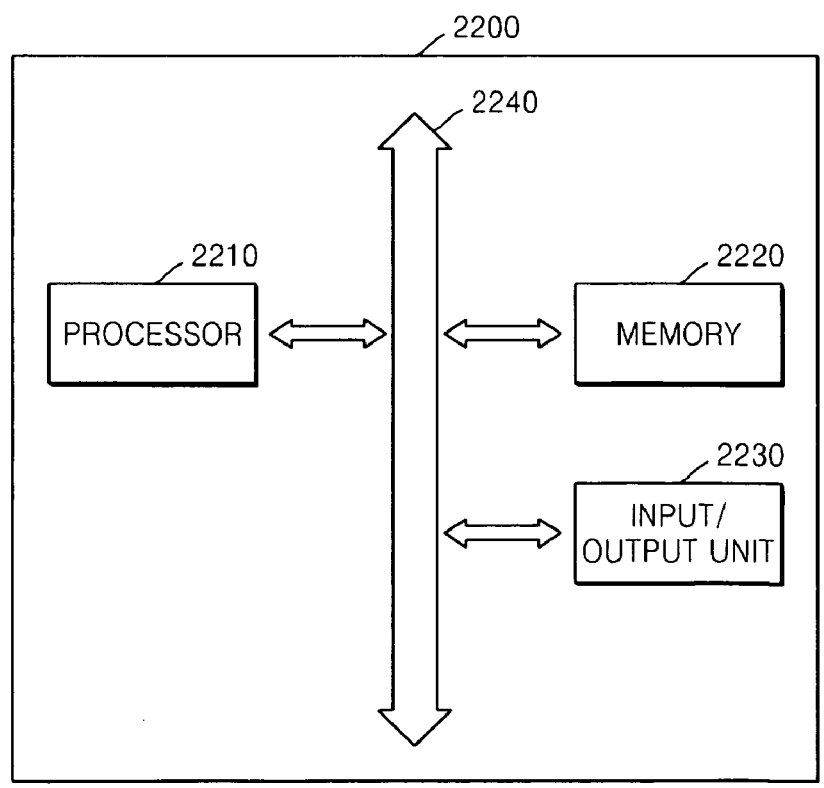
FIG. 22 is a block diagram of an electronic system according to example embodiments.

FIG. 22 is a block diagram of an electronic system 2200 according to example embodiments. Referring to FIG. 22, the electronic system 2200 may include a processor 2210, a memory unit 2220, and an input/output unit 2230, wherein the processor 2210, the memory unit 2220, and the input/output unit 2230 may communicate data with one another via a bus 2240. The processor 2210 may execute a program and may control the electronic system 2200. The input/output unit 2230 may be used to input or output data output from the electronic system 2200. The electronic system 2200 may be connected to an external device, such as a personal computer or a network, via the input/output unit 2230 and may exchange data with the external device. The memory unit 2220 may store codes for operating the processor 2210 and the data. For example, the memory unit 2220 may include any one of the nonvolatile memory devices according to example embodiments of FIGS. 1 through 20.

For example, the electronic system 2200 may include various electronic devices including a memory unit and may be used in mobile phones, MP3 players, navigation devices, solid state drives (SSD), household appliances or the like.

According to the one or more example embodiments, in a nonvolatile memory cell including a bidirectional diode and a variable resistor, the sum of magnitudes of first and second threshold voltages may be controlled to be greater than a write voltage of the variable resistor so that a leakage current and noise that may occur in a nonvolatile memory cell in which a write operation is not performed, may be reduced.

Furthermore, when the magnitude of the first threshold voltage of the bidirectional diode is greater than the magnitude of the second threshold voltage of the bidirectional diode and the magnitude of a first write voltage of the variable resistor is greater than the magnitude of a second write voltage of the variable resistor, the bidirectional diode may be connected to the variable resistor in an opposite direction to the variable resistor, and when the magnitude of the first threshold voltage of the bidirectional diode is greater than the magnitude of the second threshold voltage of the bidirectional diode and the magnitude of the first write voltage of the variable resistor is less than the magnitude of the second write voltage of the variable resistor, the bidirectional diode may be connected to the variable resistor in the same direction as the variable resistor so that the magnitudes of forward and reverse voltages that are used to perform a write operation on a memory cell may be controlled to be somewhat similar to each other. Thus, since the level of voltage that is used to perform the write operation on the memory cell may be reduced, the size of a boosting circuit may be reduced, and the level of current that flows through the memory cell during the Write operation may be reduced.

Furthermore, a replica element corresponding to the bidirectional diode included in a memory cell array may be disposed in a row decoder or a row driver disposed outside the memory cell array. Thus, although the threshold voltage of the bidirectional diode is varied due to a variation of temperature, pressure or process, a driving voltage that is corrected based on the varied threshold voltage may be applied to the memory cell array so that the leakage current and noise may be reduced. Furthermore, an additional voltage generator for supplying a inhibit voltage to be applied to the memory cell of the memory cell array in which the write operation is not performed, does not have to be provided so that the area of the nonvolatile memory device may be reduced.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:
1. A nonvolatile memory cell comprising:
a bidirectional switch having a first threshold voltage when a forward current is applied to the bidirectional switch and a second threshold voltage when a reverse current is applied to the bidirectional switch; and a variable resistor connected to the bidirectional switch in series, the variable resistor being in a high resistance state or low resistance state based on a voltage applied to the variable resistor,
  wherein a sum of a magnitude of the first threshold voltage and a magnitude of the second threshold voltage is greater than a write voltage used to perform a write operation on the variable resistor.

2. The nonvolatile memory cell of claim 1, wherein a potential difference across the nonvolatile memory cell during the write operation is greater than or equal to a sum of the first threshold voltage and the write voltage or a sum of the second threshold voltage and the write voltage.

3. The nonvolatile memory cell of claim 1, wherein the write voltage includes a first write voltage having a positive value and a second write voltage having a negative value.

4. The nonvolatile memory cell of claim 3, wherein the first write voltage writes data '0' in the nonvolatile memory cell and is a reset voltage, and the second write voltage writes data '1' in the nonvolatile memory cell and is a set voltage.

5. The nonvolatile memory cell of claim 3, wherein the bidirectional switch comprises a bidirectional diode.

6. The nonvolatile memory cell of claim 3, wherein, when the magnitude of the first threshold voltage is less than the magnitude of the second threshold voltage and a magnitude of the first write voltage is greater than a magnitude of the second write voltage, the bidirectional switch is connected to the variable resistor in the same direction as the variable resistor.

7. The nonvolatile memory cell of claim 3, wherein, when the magnitude of the first threshold voltage is greater than the magnitude of the second threshold voltage and the magnitude of the first write voltage is less than the magnitude of the second write voltage, the bidirectional switch is connected to the variable resistor in the same direction as the variable resistor.

8. The nonvolatile memory cell of claim 3, wherein, when the magnitude of the first threshold voltage is less than the magnitude of the second threshold voltage and the magnitude of the first write voltage is less than the magnitude of the second write voltage, the bidirectional switch is connected to the variable resistor in an opposite direction to the variable resistor.

9. The nonvolatile memory cell of claim 3, wherein, when the magnitude of the first threshold voltage is greater than the magnitude of the second threshold voltage and the magnitude of the first write voltage is greater than the magnitude of the second write voltage, the bidirectional switch is connected to the variable resistor in an opposite direction to the variable resistor.

10. A nonvolatile memory device comprising:
  a memory cell array unit including a plurality of word lines, a plurality of bit lines; and a plurality of nonvolatile memory cells, the plurality of memory cells being at intersections of the plurality of bit lines and the plurality of bit lines, wherein each of the plurality of nonvolatile memory cells comprises a bidirectional switch and a variable resistor connected to the bidirectional switch in series; and
  a row driver configured to supply voltage to the plurality of word lines, the row driver including at least one replica element corresponding to the bidirectional switch and the row driver configured to control voltage applied to a nonvolatile memory cell of the plurality of nonvolatile memory cells in which a write operation is not performed.

11. The nonvolatile memory device of claim 10, wherein the bidirectional switch has a first threshold voltage when a forward current is applied to the bidirectional switch and a second threshold voltage when a reverse current is applied to the bidirectional switch, and a resistance state of the variable resistor depends on a voltage applied to a word line of the plurality of word lines connected to the variable resistor and a voltage applied to a bit line of the plurality of bit lines connected to the variable resistor.

12. The nonvolatile memory device of claim 10, wherein the row driver comprises:
  a first driver configured to supply a write voltage to the plurality of word lines based on a write signal and configured to supply a ground voltage to the plurality of word lines based on a discharge signal; and
  a second driver including the at least one replica element and configured to supply an inhibit voltage to the plurality of word lines based on a plurality of inhibit signals, the inhibit voltage being controlled by a threshold voltage of the at least one replica element.

13. The nonvolatile memory device of claim 12, wherein the first driver comprises:
  a write voltage supplying unit configured to supply the write voltage when the write enable signal is activated; and
  a ground voltage supplying unit connected to the write voltage supplying unit and configured to supply the ground voltage when the discharge signal is activated.

14. The nonvolatile memory device of claim 12, wherein the second driver comprises:
  first and second replica elements corresponding to the bidirectional switch, the first and second replica elements respectively connected to a write voltage terminal to which the write voltage is applied and a ground voltage terminal to which the ground voltage is applied;
  a first inhibit voltage supplying unit configured to supply a difference of the write voltage and a threshold voltage of the first replica element as a first inhibit voltage when a first inhibit signal of the plurality of inhibit signals is activated;
  a second inhibit voltage supplying unit configured to supply a threshold voltage of the second replica element as a second inhibit voltage when a second inhibit signal of the plurality of inhibit signals is activated; and
  a third inhibit voltage supplying unit configured to supply a power supply voltage as a third inhibit voltage when a third inhibit signal of the plurality of inhibit signals is activated.

15. The nonvolatile memory device of claim 10, further comprising a row decoder configured to decode an input row address into an address signal and to apply the voltage supplied by the row driver to the plurality of word lines based on the address signal.

16. The nonvolatile memory device of claim 15, wherein the row decoder comprises:
  a first decoder configured to decode a desired bit value of the row address into a first address signal corresponding to a plurality of main word lines; and
  a second decoder configured to decode a remainder of bit values of the row address not decoded by the first decoder into a second address signal, the second address signal corresponding to the plurality of word lines, and the second decoder configured to connect word lines corresponding to the second address signal to the plurality of main word lines.

17. The nonvolatile memory device of claim 16, wherein at least one of the first decoder and the second decoder comprises at least one replica element corresponding to the bidirectional switch.

18. The nonvolatile memory device of claim 10, further comprising:
a row decoder configured to decode a row address into an address signal and configured to supply a voltage to the plurality of word lines according to the decoded address signal,
wherein the row decoder includes at least one replica element corresponding to the bidirectional switch and the row decoder controls the voltage supplied to the plurality of memory cells.

19. The nonvolatile memory device of claim 18, wherein a resistance state of the variable resistor depends on a voltage applied to a word line of the plurality of word lines connected to the variable resistor and voltage applied to a bit line of the plurality of bit lines connected to the variable resistor.

20. The nonvolatile memory device of claim 18, wherein the row decoder comprises:
a first decoder configured to decode a desired bit value of the row address into a first address signal corresponding to a plurality of main word lines; and
a second decoder configured to decode a remainder of the bit values of the row address not decoded by the first decoder into a second address signal, the second address signal corresponding to the plurality of word lines, and the second decoder configured to connect word lines corresponding to the second address signal to the plurality of main word lines.

21. The nonvolatile memory device of claim 18, wherein the row driver supplies at least one of a write voltage, an inhibit voltage and a ground voltage to the plurality of word lines based on the address signal decoded by the row decoder, the row driver including at least one replica element corresponding to the bidirectional switch and the row driver configured to control the inhibit voltage applied to the memory cell of the plurality of memory cells in which a write operation is not performed.

* * * * *